United States Patent
Ogushi

Patent Number: 5,943,589
Date of Patent: Aug. 24, 1999

[54] METHOD OF FABRICATING SEMICONDUCTOR DEVICE WITH A TRENCH ISOLATION

[75] Inventor: Hiroshi Ogushi, Yamagata, Japan

[73] Assignee: NEC Corporation, Tokyo, Japan

[21] Appl. No.: 09/015,531

[22] Filed: Jan. 29, 1998

[30] Foreign Application Priority Data

Jan. 30, 1997 [JP] Japan .................................. 9-016781

[51] Int. Cl.⁶ .................................................. H01L 21/76
[52] U.S. Cl. ........................ 438/407; 438/430; 438/433; 438/270
[58] Field of Search .................................. 438/433, 430, 438/270, 407; 148/DIG. 82, DIG. 83

[56] References Cited

U.S. PATENT DOCUMENTS

| H204 | 2/1987 | Oh et al. .................................. 438/433 |
| 4,523,369 | 6/1985 | Nagakubo ................................. 438/433 |
| 5,142,640 | 8/1992 | Iwamatsu ................................. 257/332 |
| 5,643,822 | 7/1997 | Furukawa et al. ....................... 438/421 |
| 5,780,346 | 7/1998 | Arghavani et al. ...................... 438/296 |
| 5,854,131 | 12/1998 | Gardner et al. .......................... 438/425 |

FOREIGN PATENT DOCUMENTS

| 1-155654 | 6/1989 | Japan . |
| 2-23664 | 1/1990 | Japan . |
| 3-66165 | 3/1991 | Japan . |

Primary Examiner—Michael Trinh
Assistant Examiner—Maria Guerrero
Attorney, Agent, or Firm—Sughrue, Mion, Zinn, Macpeak & Seas, PLLC

[57] ABSTRACT

A trench is formed on the surface of a semiconductor substrate. An oxide film is then formed on the side wall portion and the bottom portion of the trench, ions are implanted at least in the side wall portion of the trench for preventing an impurity from passing through there. Thereafter the ion-implanted portion is subjected to a heat treatment, whereby an impurity passing-through preventing film is formed between the bulk of the semiconductor substrate and the oxide film.

16 Claims, 4 Drawing Sheets

METHOD OF FABRICATING SEMICONDUCTOR DEVICE WITH A TRENCH ISOLATION

BACKGROUND OF THE INVENTION

1. Field of the Invention

The present invention relates to a method of fabricating a semiconductor device with a trench isolation, where the trench has a small width and a large depth. More particularly, the present invention relates to a method of fabricating a semiconductor device with a trench isolation suitable for fabricating a MOS transistor having a uniform threshold voltage.

2. Description of the Related Art

In recent years, an isolation structure by use of a narrow and deep trench, which is formed on a surface of a semiconductor substrate, and which is filled with an $SiO_2$ film, or a stacked layer of an $SiO_2$ film and a polycrystal silicon film, has been employed in a semiconductor device with progress in miniaturization of semiconductor devices.

A conventional method of fabricating a semiconductor device with a trench isolation will be described. FIG. 1A is a plan view showing a conventional method of fabricating a semiconductor device and FIG. 1B is a sectional view taken along line 1B—1B of FIG. 1. FIG. 2 is a sectional view showing a subsequent process step to the process step shown in FIGS. 1A and 1B. FIG. 3A is a plan view showing a further process step subsequent to that shown in FIG. 2 and FIG. 3B is a sectional view taken along line 2B—2B of FIG. 3A. In the conventional method of fabricating a semiconductor device, first a pad oxide film 22 format and a silicon nitride film 23 sequentially, for example, on a p-type silicon semiconductor substrate 21. As shown in FIGS. 1A and 1B a trench reaching the silicon semiconductor substrate 21 is formed by use of photolithographic technique, dry etching technique and the like. Thus a first active region 25a and a second active region 25b are divided.

As shown in FIG. 2, a first silicon oxide film 26 is formed by thermal oxidation in a region on a surface of the silicon semiconductor substrate 21 where a trench 24 is formed. The interior of the trench 24 is filled with a second silicon oxide film 27 by means of a CVD method. Subsequently the pad oxide film 22 and the silicon nitride film 23 in the first active region 25a or the second active region 25b are removed by a CMP (Chemical Mechanical Polishing) method or an etching-back method to flatten the surface.

As shown in FIGS. 3A and 3B, a gate oxide film 28 is formed on the surface of the silicon semiconductor substrate 21. A channel-doped layer 29 is formed by implanting ions of a p-type impurity such as boron or the like in a predetermined region where a channel of a MOS transistor is to be formed. Then a gate electrode 30 traversing the active regions 25a and 25b is formed on the channel-doped layer 29. An n-type impurity is ion-implanted in the active region 25a and 25b with the gate electrode as a mask and the active regions 25a and 25b receive a heat treatment, so that source/drain regions 31a and 31b are formed.

In a fabricated semiconductor device fabricated according to the above described method, a punch-through phenomenon between elements respectively fabricated in these regions is suppressed since the active regions 25a and 25b are isolated by the deep trench 24.

However, since a heat treatment is conducted after an impurity such as boron or the like is ion-implanted to form the channel-doped layer 29, the implanted impurity is diffused up to the second silicon oxide film 27. For that reason, the impurity concentration is not uniform at an end 29a of the channel-doped layer 29 on the side of the trench 24. FIG. 4 is a graph showing a relation between the gate voltage $V_G$ and the drain current $I_D$ of a semiconductor device fabricated by means of the conventional method with values of the gate voltage $V_G$ shown on the horizontal axis and values of the drain current $I_D$ shown on the vertical axis. The gate voltage $V_G$ vs. drain current $I_D$ characteristics of a semiconductor device fabricated by means of the conventional method are like superposition of the characteristics of two transistors of different kinds and an irregularity like a bump is observed on the curve as shown in FIG. 4. This irregularity is the result of the non-uniformity in threshold voltage as mentioned above.

There have been proposed methods of fabricating semiconductor devices each with a trench isolation (Japanese Unexamined Patent Publication Nos. Hei 1-155654 and Hei 2-23664). According to a conventional fabricating method described in Japanese Unexamined Patent Publication No. Hei 1-155654, a trench is formed on a silicon substrate. Thereafter a silicon oxide film is formed by a thermal oxidation method on the side wall portion and the bottom portion of the trench on the semiconductor substrate. Then ion implantation is carried out in the side wall portion and the bottom portion, and subsequently, a heat treatment is given there to further form a silicon oxide film. A semiconductor device fabricated by means of this fabrication method has a similar structure to the device as mentioned above.

On the other hand, according to a fabricating method described in Japanese Unexamined Patent Publication No. Hei 2-23664, in order to prevent a leakage in a trench capacitor or a trench gate, after a trench is formed on a semiconductor substrate, oxygen ions are implanted in the region on the semiconductor substrate where a trench is formed and the region is annealed. Thus an oxide film is formed and the region where the trench is formed comes to have an SOI structure.

Even in semiconductor devices fabricated by these methods, the problem that a threshold voltage is not uniform resulting in the observable irregularity on the gate voltage $V_G$ vs. drain current $I_D$ characteristics curve. There is another method, which is associated with Japanese Unexamined Patent Publication No. Hei 2-23664, in which nitrogen ions are implanted instead of oxygen ions and annealing is given, for example, in the range of 1000 to 1100° C., but, since a silicon nitride buried layer is formed in a semiconductor device fabricated by means of the method, many crystal defects are present in the device and a leakage current is apt to occur.

Another method of fabricating a semiconductor device has further been proposed, though it is not related to a trench isolation, in which a film preventing a diffusion of an impurity is provided in order to prevent a punch-through phenomenon caused by a short channel effect (Japanese Unexamined Patent Publication No. Hei 3-66165). According to a method of fabricating a semiconductor device disclosed in the publication, oxygen or nitrogen ions, which are both low in thermal diffusion coefficient, are implanted in a boundary portion between a predetermined source/drain region and the bulk of a semiconductor substrate and an annealing treatment follows thereafter.

In the conventional fabricating method, since a region implanted with oxygen and nitrogen ions is already formed, phosphorus implanted in predetermined regions, where source/drain regions are to be formed, are mainly diffused in a horizontal direction by annealing.

However, even if this method is applied to a trench isolation in a device, a threshold voltage is not sufficiently uniform.

SUMMARY OF THE INVENTION

A method of fabricating a semiconductor device with a trench isolation according to the present invention comprises the steps of: forming a trench on a surface of a semiconductor substrate; forming an oxide film on the side wall portion and the bottom portion of the trench; implanting ions at least in the side wall portion of the trench under the oxide film; and conducting a heat treatment to form an impurity passing-through preventing film between the bulk of the semiconductor substrate and the oxide film. The impurity passing-through preventing film prevents an impurity from passing through itself.

According to the present invention, since the impurity passing-through preventing film is formed between the bulk of the semiconductor substrate and the oxide film on the side wall portion of the trench by ion implanting and the heat treatment, even when impurity ions are implanted in the semiconductor substrate and a heat treatment is conducted in later process steps, it is prevented that the impurity is diffused into material filled in the trench. For the reason, in the case where a MOS transistor is fabricated, a threshold voltage can be uniform and gate voltage $V_G$ vs. drain current $I_D$ characteristics without any irregularity on a curve thereof can be obtained.

DETAILED DESCRIPTION OF THE PREFERRED EMBODIMENTS

Figure 1A:
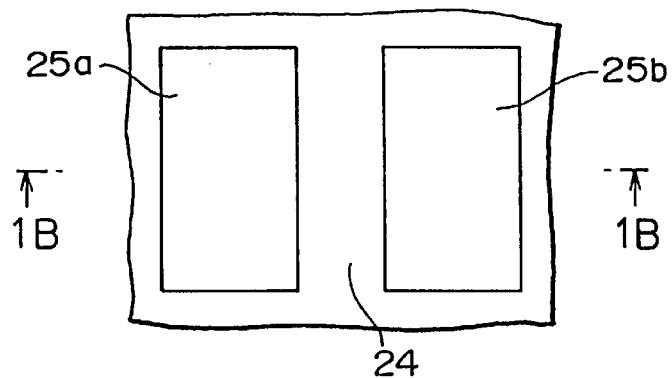
FIG. 1A is a plan view showing a conventional method of fabricating a semiconductor device and FIG. 1B is a sectional view taken along line 1B—1B of FIG. 1.
Figure 1B:
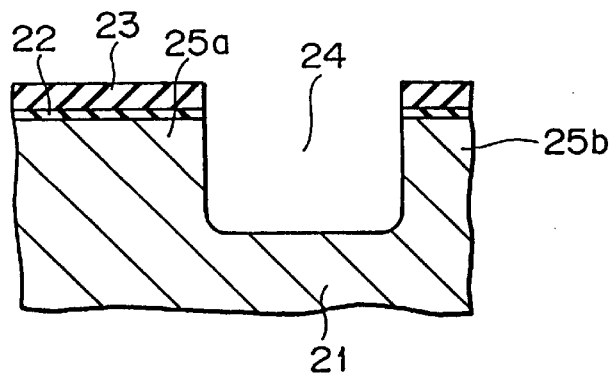
Figure 2:
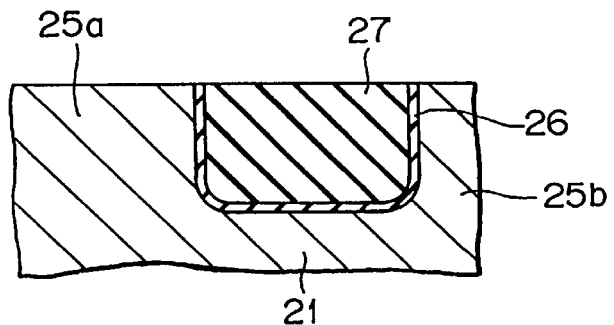
FIG. 2 is a sectional view showing a subsequent process step to the process step shown in FIGS. 1A and 1B.
Figure 3A:
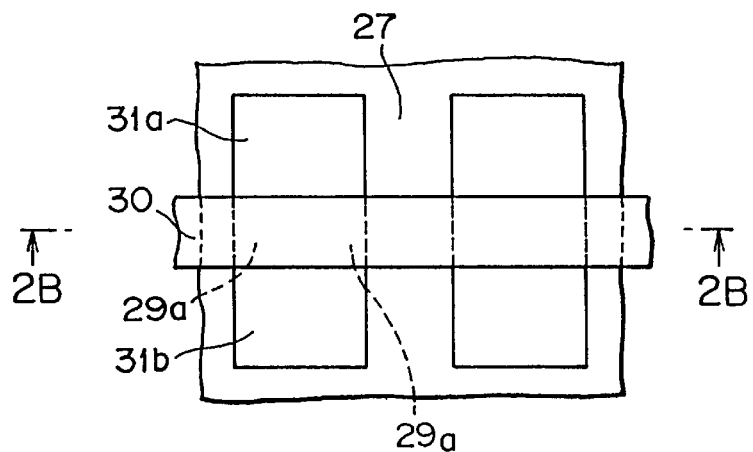
FIG. 3A is a plan view showing a further subsequent process step to that shown in FIG. 2
Figure 3B:
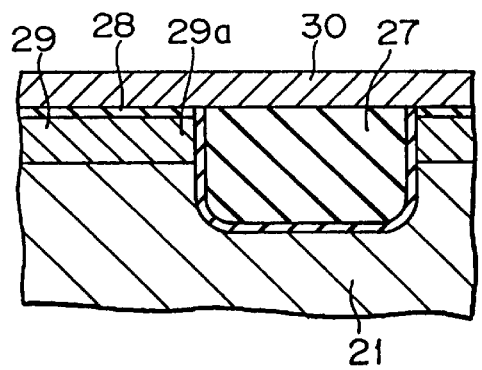
FIG. 3B is a sectional view taken along line 2B—2B of FIG. 3A.
Figure 4:
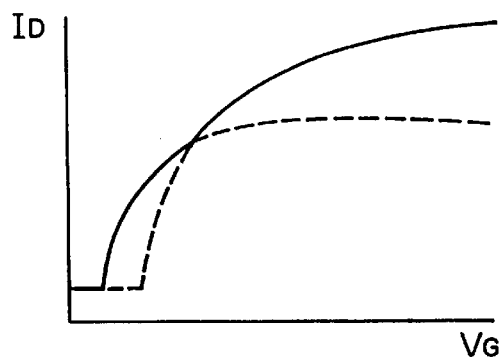
FIG. 4 is a graph showing a relation between the gate voltage $V_G$ and the drain current $I_D$ of a semiconductor device fabricated by means of a conventional fabricating method.
Figure 5A:
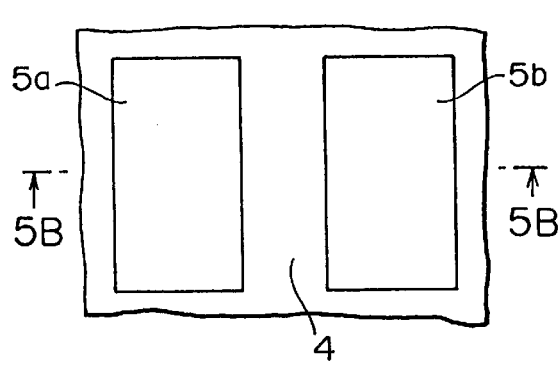
FIG. 5A is a plan view showing a method of fabricating a semiconductor device according to an embodiment of the present invention and FIG. 5B is a sectional view taken along line 5B—5B of FIG. 5A.
Figure 5B:
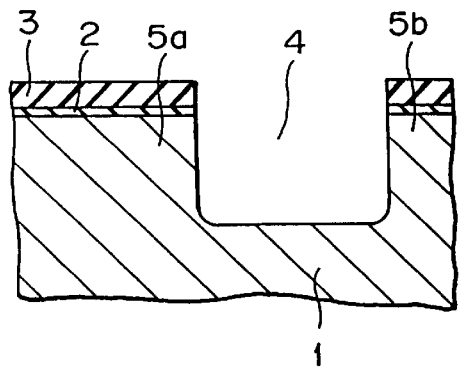
Figure 6:
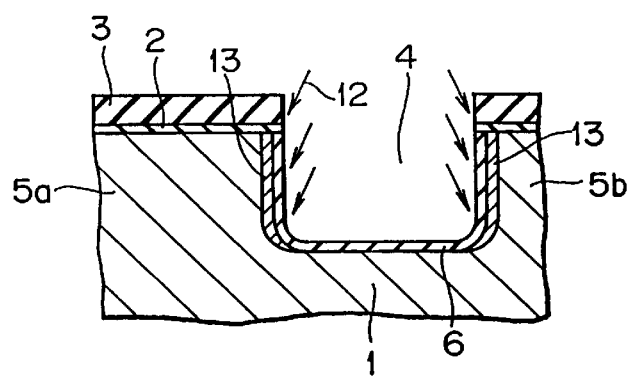
FIG. 6 is a sectional view showing a subsequent process step to the process step shown in FIGS. 5A and 5B.
Figure 7:
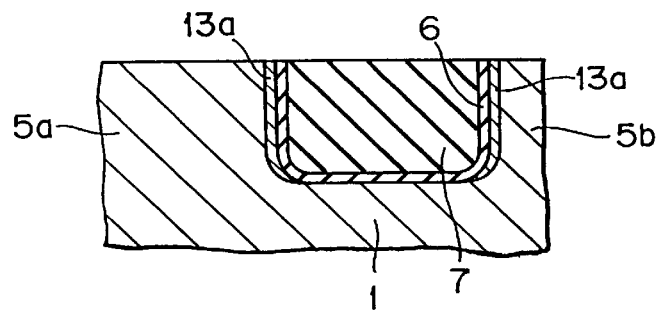
FIG. 7 is a sectional view showing a further subsequent process step to that shown in FIG. 6.
Figure 8A:
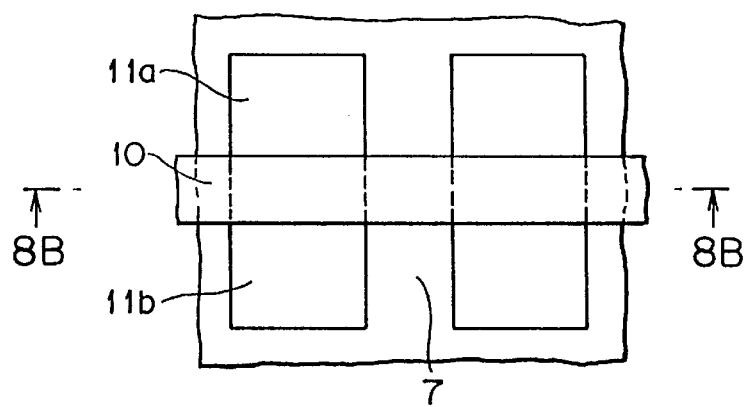
FIG. 8A is a plan view showing a still further subsequent process step to that shown in FIG. 7
Figure 8B:
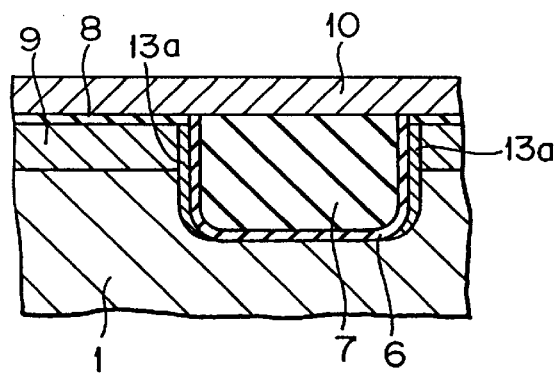
FIG. 8B is a sectional view taken along line 8B—8B of FIG. 8A.

Below, a method of fabricating a semiconductor device according to an embodiment of the present invention will be described in a concrete manner in reference to the accompanying drawings. FIG. 5A is a plan view showing a method of fabricating a semiconductor device according to the embodiment of the present invention and FIG. 5B is a sectional view taken along line 5B—5B of FIG. 5A. FIG. 6 is a sectional view showing a process step subsequent to the process step shown in FIGS. 5A and 5B. FIG. 7 is a sectional view showing a further process step subsequent to that shown in FIG. 6. FIG. 8A is a plan view showing a still further subsequent process step to that shown in FIG. 7 and FIG. 8B is a sectional view taken along line 8B—8B of FIG. 8A. In the embodiment, for example, first a pad oxide film 2 and a silicon nitride film 3 are formed on a p-type silicon semiconductor substrate 1 in sequential order, as shown in FIGS. 5A and 5B. A trench 4 reaching the bulk of the silicon semiconductor substrate 1 is formed by photolithographic technique, dry etching technique and the like. Thereby, a first active region 5a and a second active region 5b are divided.

As shown in FIG. 6, a first oxide film 6 having a thickness of, for example, 40 nm is formed by thermal oxidation in a region on a surface of the silicon semiconductor substrate 1 where the trench 4 has been formed. Then implantation of nitrogen ions 12 is carried out to form an ion-implanted layer 13 at the boundary between the bulk of the silicon semiconductor substrate 1 and the first silicon oxide film 6 and in the vicinity of the boundary in the side wall portion of the trench 4. The nitrogen ion 12 implantation is conducted along a direction inclined, for example, by 30° from a normal to the surface of the semiconductor substrate, wherein an ion beam source is rotated about the normal as a rotational axis while the beam is projected obliquely to the surface.

The ion-implanted layer may be formed at a boundary between the bulk of the silicon semiconductor substrate 1 and the first silicon oxide film 6 and in the vicinity of the boundary in the bottom portion of the trench 4.

Damages in a crystal produced by the ion implantation can be healed by applying RTA (Rapid Thermal Annealing), for example, at 800° C. for 30 sec. The ion-implanted layer 13 is transformed into an impurity passing-through preventing film 13a which prevents the impurity from passing through itself. Subsequently, the interior of the trench 4 is filled up with a second silicon oxide film 7 by means of a CVD method. The pad oxide film 2 and the silicon nitride film 3 in active region 5a or 5b is removed by a CMP (Chemical Mechanical Polishing) method, a combination of a CVD method and an etching-back method, or the like to flatten the surface.

As shown in FIGS. 8A and 8B, a gate oxide film 8 having a thickness of the order in the range of 6.5 to 8 nm is formed on the surface of the silicon semiconductor substrate 1 by conducting a heat treatment, for example, at about 750° C. A channel-doped layer 9 is formed by implementing boron ions in a predetermined region where a channel of an n-type MOS transistor is to be formed. Then a gate electrode 10 traversing the active regions 5a and 5b is formed on the channel-doped layer 9. For example, phosphorus or arsenic ions are implanted in the active regions with the gate electrode 10 as a mask and thereby source/drain regions 11a and 11b are formed.

Figure 9:
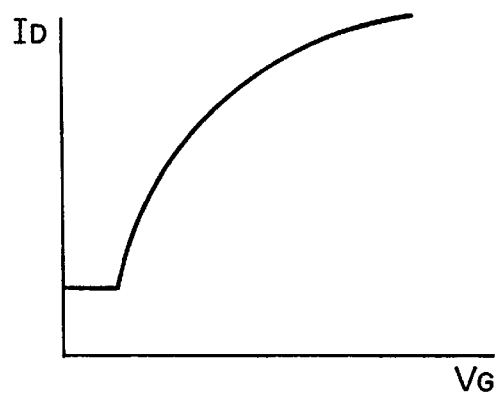
FIG. 9 is a graph showing a relation between the gate voltage $V_G$ and the drain current $I_D$ of a semiconductor device fabricated in the embodiment.

In the embodiment, since the passing-through preventing film 13a is formed between the channel-doped layer 9 and each of the silicon oxide films 6 and 7, diffusion of boron from a portion of the channel doped layer 9, which is located directly under the gate electrode 10, to the silicon oxide film 6 or 7 is prevented even when a heat treatment is conducted in a later step, after formation the passing-through preventing film 13a. Thereby, an impurity concentration in the channel-doped layer 9 is uniform, so that a threshold voltage of a MOS transistor formed in this region is also uniform. FIG. 9 is a graph showing a relation between the gate voltage $V_G$ and the drain current $I_D$ of a semiconductor device fabricated in the embodiment with taking values of the gate voltage $V_G$ on the horizontal axis and values of the drain current $I_D$ on the vertical axis. Characteristics of one transistor of a kind are only shown in the characteristics of the semiconductor device fabricated in the embodiment but no irregularity like a bump is observed on the curve of the characteristics, said irregularity being observed on a curve of the kind of a semiconductor device fabricated in a conventional fabricating method. This is because a threshold voltage is uniform, as described above.

While in the embodiment nitrogen ions are implanted and annealing is then conducted, since an annealing temperature is as low as 800° C., a deposition layer of silicon nitride is not formed and thus there is no risk to produce a leakage current.

While in the embodiment nitrogen ions 12 are implanted to form an impurity passing-through preventing film 13a, a method of the present invention is not limited to use of nitrogen ion implantation. Any ions can be used as far as they can prevent diffusion of an impurity present in a region directly under the gate electrode to the trench.

An impurity that is implanted to form the channel-doped region 9 is not limited to boron either.

What is claimed is:

1. A method of fabricating a semiconductor device with trench isolation comprising the steps of:

forming a trench on a surface of a semiconductor substrate;

forming an oxide film on the sidewall portion and the bottom portion of said trench;

implanting ions, said ions passing through said oxide film, in said side wall portion of said trench under said oxide film; and conducting a heat treatment causing said implanted ions to form an impurity passing-through preventing film between the bulk of said semiconductor substrate and said oxide film, said impurity passing-through preventing film preventing an impurity from passing through itself.

2. A method of fabricating a semiconductor device with a trench isolation according to claim 1, wherein the step of forming said oxide film comprises the step of forming the oxide film by thermal oxidation.

3. A method of fabricating a semiconductor device with a trench isolation according to claim 1, which further comprises the step of filling said trench with a silicon film by means of a CVD method.

4. A method of fabricating a semiconductor device with a trench isolation according to claim 1, which further comprises the steps of:

forming a gate oxide film in a region divided by said trench; and implanting an impurity to a predetermined channel-forming region in which a channel is to be formed in said divided region.

5. A method of fabricating a semiconductor device with a trench isolation according to claim 4, wherein said impurity is boron.

6. A method of fabricating a semiconductor device with a trench isolation according to claim 1, wherein said heat treatment is conducted at 800° C. for 30 sec.

7. A method of fabricating a semiconductor device with a trench isolation according to claim 4, which further comprises the steps of:

forming a gate electrode on said gate oxide film in said predetermined channel-forming region; and implanting ions of one selected from the group consisting of phosphorus and arsenic with said gate electrode as a mask, whereby an n-channel MOS transistor is formed.

8. A method of fabricating a semiconductor device with a trench isolation according to claim 4, wherein a film thickness of said gate oxide film is in the range of 6.5 to 8 nm.

9. A method of fabricating a semiconductor device with a trench isolation according to claim 4, wherein the step of forming said gate oxide film comprises the step of forming the gate oxide film by thermal oxidation substantially at 750° C.

10. A method of fabricating a semiconductor device with a trench isolation according to claim 1, wherein a thickness of said oxide film is 40 nm.

11. A method of fabricating a semiconductor device with a trench isolation according to claim 1, wherein the step of implanting said ions comprises the step of implanting the ions in the side wall portion and the bottom portion of said trench.

12. A method of fabricating a semiconductor device with a trench isolation according to claim 1, wherein said ions are nitrogen ions.

13. A method of claim 1, wherein the step of implanting further comprises implanting said ions using a ion beam source.

14. A method of claim 13, wherein the step of implanting further comprises implanting said ions along an axis inclined by substantially 30° from a normal to the surface of said semiconductor substrate.

15. A method of claim 13, wherein the step of implanting further comprises rotating said ion beam source about said normal as an axis of rotation while said ion beam is projected obliquely to the surface of said substrate.

16. A method of claim 1, wherein a uniform threshold voltage is obtained.

* * * * *